United States Patent
Jung et al.

(10) Patent No.: US 9,978,431 B2
(45) Date of Patent: *May 22, 2018

(54) LINE MEMORY DEVICE AND IMAGE SENSOR INCLUDING THE SAME

(71) Applicant: SAMSUNG ELECTRONICS CO., LTD., Suwon-si, Gyeonggi-do (KR)

(72) Inventors: Wun-Ki Jung, Suwon-si (KR); Min-Ho Kwon, Seoul (KR); Kwi-Sung Yoo, Seoul (KR); Won-Ho Choi, Suwon-si (KR); Dong-Hun Lee, Yongin-si (KR); Seog-Heon Ham, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 318 days.

This patent is subject to a terminal disclaimer.

(21) Appl. No.: 14/819,978

(22) Filed: Aug. 6, 2015

(65) Prior Publication Data
US 2015/0340070 A1    Nov. 26, 2015

Related U.S. Application Data

(63) Continuation of application No. 13/757,977, filed on Feb. 4, 2013, now Pat. No. 9,135,963.

(30) Foreign Application Priority Data

Mar. 5, 2012 (KR) .................. 10-2012-0022163

(51) Int. Cl.
*G11C 7/06* (2006.01)
*G11C 7/10* (2006.01)
(Continued)

(52) U.S. Cl.
CPC .................. *G11C 7/06* (2013.01); *G11C 7/10* (2013.01); *G11C 7/1033* (2013.01);
(Continued)

(58) Field of Classification Search
CPC .... G11C 7/06; G11C 7/08; G11C 7/10; G11C 7/103; G11C 7/1033; G11C 7/1051;
(Continued)

(56) References Cited

U.S. PATENT DOCUMENTS 5,021,977 A    6/1991    Sakaguchi
7,142,239 B2   11/2006   Cho
(Continued)

FOREIGN PATENT DOCUMENTS

JP    2010-074649         4/2010
KR    10-2003-0023294 A   3/2003
KR    10-2010-0030438 A   2/2010

OTHER PUBLICATIONS

Korean Intellectual Property Office (KIPO) Office Action dated Feb. 19, 2018 in Related Korean Patent Application No. 10-2012-0022163.

*Primary Examiner* — John Lee
(74) *Attorney, Agent, or Firm* — Volentine, Whitt & Francos, PLLC (57) ABSTRACT

A line memory device includes a plurality of memory cells, a data line pair, a sense amplifier and an output unit. The plurality of memory cells are disposed adjacent to each other in a line. The data line pair is coupled to the memory cells to sequentially transfer memory data bits stored in the memory cells to the sense amplifier. The sense amplifier is configured to amplify the memory data bits that are sequentially transferred through the data line pair by corresponding delay times which are different from each other. The output unit samples an output of the sense amplifier to sequentially
(Continued)

output retimed data bits of the memory data bits in response to a read clock signal. The read clock signal has a cyclic period which is less than a maximum delay time among the delay times.

20 Claims, 9 Drawing Sheets

(51) Int. Cl.
*H01L 27/146* (2006.01)
*G11C 7/22* (2006.01)
*G11C 19/00* (2006.01)
*G11C 27/02* (2006.01)

(52) U.S. Cl.
CPC .............. *G11C 7/1051* (2013.01); *G11C 7/22* (2013.01); *G11C 19/00* (2013.01); *G11C 27/02* (2013.01); *H01L 27/146* (2013.01); *H01L 27/14634* (2013.01); *H01L 27/14643* (2013.01)

(58) Field of Classification Search
CPC ......... G11C 7/1069; G11C 7/22; G11C 7/227; G11C 19/00; G11C 27/02; G11C 27/026; H01L 27/00; H01L 27/144; H01L 27/146; H01L 27/14634; H01L 27/14643; H04N 5/335; H03M 1/12
See application file for complete search history.

(56) References Cited

U.S. PATENT DOCUMENTS

| | | | |
|---|---|---|---|
| 7,659,925 B2 | 2/2010 | Krymski | |
| 7,804,438 B2 | 9/2010 | Krymski | |
| 8,432,761 B2 | 4/2013 | Kim et al. | |
| 9,135,963 B2* | 9/2015 | Jung | G11C 7/06 |
| 2002/0097623 A1* | 7/2002 | Suzuki | G11C 7/22 |
| | | | 365/210.1 |
| 2003/0011829 A1 | 1/2003 | Dierickx | |
| 2005/0169078 A1* | 8/2005 | Balasubramanian | G11C 7/067 |
| | | | 365/207 |
| 2008/0258042 A1 | 10/2008 | Krymski | |
| 2009/0086075 A1 | 4/2009 | Saito | |
| 2009/0231934 A1* | 9/2009 | Jung | G11C 7/08 |
| | | | 365/189.15 |
| 2010/0177580 A1* | 7/2010 | Komatsu | G11C 7/08 |
| | | | 365/203 |
| 2010/0182448 A1 | 7/2010 | Takahashi | |
| 2010/0271525 A1 | 10/2010 | Takahashi | |
| 2012/0257464 A1* | 10/2012 | Moriwaki | G11C 11/419 |
| | | | 365/189.11 |
| 2013/0228672 A1* | 9/2013 | Jung | G11C 7/06 |
| | | | 250/208.1 |
| 2015/0340070 A1* | 11/2015 | Jung | G11C 7/06 |
| | | | 250/208.1 |

* cited by examiner

LINE MEMORY DEVICE AND IMAGE SENSOR INCLUDING THE SAME

CROSS-REFERENCE TO RELATED APPLICATION

This application is a Continuation of U.S. application Ser. No. 13/757,977, filed Feb. 4, 2013, now U.S. Pat. No. 9,135,963 issued on Sep. 15, 2015, which claims priority under 35 USC § 119 to Korean Patent Application No. 10-2012-0022163, filed on Mar. 5, 2012, in the Korean Intellectual Property Office (KIPO), the contents of which are herein incorporated by reference in their entirety.

BACKGROUND

Example embodiments relate generally to semiconductor devices, and more particularly to a line memory device and an image sensor including the line memory device.

Portable devices such as a digital camera, a camera phone, etc. include an image sensor configured to capture an image and particularly a complementary metal-oxide semiconductor (CMOS) image sensor (CIS) is widely used in the portable devices. The CIS generally includes a line buffer memory to increase a data processing speed. Outputs of an analog-to-digital converter (ADC) may be stored in the line buffer memory and the line buffer memory may output the stored data while the ADC performs a conversion process for the next data.

A plurality of memory cells in the line buffer memory are commonly coupled to a data line pair at different nodes, and data bits from the memory cells are sequentially or serially transferred to a sense amplifier through the common data line pair. In this case, the data bits are transferred to the sense amplifier with different delay times, because transfer distances from the respective memory cells to the sense amplifier are different from each other. The different delay times limit the frequency, that is, the cyclic period of a read clock signal of the line buffer memory, thereby degrading overall performance of the CIS including the line buffer memory.

SUMMARY

Some example embodiments provide a line memory device capable of decreasing a cyclic period of a read clock signal to increase an operational speed of the line memory device.

Some example embodiments provide an image sensor including a line memory device capable of decreasing a cyclic period of a read clock signal to increase an operational speed of the line memory device.

According to example embodiments, a line memory device includes a plurality of memory cells, a data line pair, a sense amplifier and an output unit. The plurality of memory cells are disposed adjacent to each other in a line. The data line pair is coupled to the memory cells to sequentially transfer to the sense amplifier memory data bits stored in the memory cells. The sense amplifier is configured to amplify the memory data bits that are sequentially transferred through the data line pair by delay times which are different from each other. The output unit samples an output of the sense amplifier to sequentially output retimed data bits of the memory data bits in response to a read clock signal. The read clock signal has a cyclic period which is less than a maximum delay time among the delay times.

The output unit may sample the output of the sense amplifier in response to a first edge of the read clock signal to output first bits of the retimed data bits, and sample the output of the sense amplifier in response to a second edge of the read clock signal to output second bits of the retimed data bits, where the first edge corresponds to one of a rising edge and a falling edge, and the second edge corresponds to the other of the rising edge and the falling edge.

The first bits of the retimed data bits may correspond to the memory data bits of first and third groups of the memory cells, and the second bits of the retimed data bits may correspond to the memory data bits of a second group of the memory cells, where the first group of the memory cells is disposed farthest away from the sense amplifier among the plurality of memory cells, where the third group of the memory cells is disposed closest to the sense amplifier among the plurality of memory cells, and where the second group of the memory cells is disposed between the first group and the third group.

The output unit may include a first shift register, a second shift register, a multiplexer and a retiming control block. The first shift register may sample the output of the sense amplifier in response to a first edge of the read clock signal, where the first edge corresponds to one of a rising edge and a falling edge. The second shift register may sample the output of the sense amplifier in response to a second edge of the read clock signal, where the second edge corresponds to the other of the rising edge and the falling edge. The multiplexer may select one of an output of the first shift register and an output of the second shift register in response to a retiming selection signal. The retiming control block may generate the retiming selection signal based on the delay times.

The retiming control block may include a detector configured to detect at least one retiming point based on the delay times different from each other, and a selection signal generator configured to generate the retiming selection signal based on the retiming point.

The detector may include a plurality of dummy memory cells, a dummy data line pair, a dummy sense amplifier, and a detection signal generator. The plurality of dummy memory cells may be disposed adjacent to each other in a line. The dummy data line pair may be coupled to the dummy memory cells to sequentially transfer to the dummy sense amplifier patterned data bits stored in the dummy memory cells. The dummy sense amplifier may be configured to sense and amplify the patterned data bits that are sequentially transferred through the dummy data line pair by dummy delay times which are different from each other. A connection of the dummy data line pair to the dummy memory cells and the dummy sense amplifier may be substantially the same as a connection of the data line pair to the memory cells and the sense amplifier so that each of the dummy delay times may be substantially the same as a corresponding one of the delay times. The detection signal generator may generate a detection signal by comparing first detection data bits and second detection data bits sampled from an output of the dummy sense amplifier. The detection signal may indicate the retiming point. The first detection data bits may be sampled in response to the first edge of the read clock signal, and the second detection data bits may be sampled in response to the second edge of the read clock signal.

The retimed data bits corresponding to the memory data bits of first and third groups of the memory cells may be provided from the second shift register that samples the output of the sense amplifier in response to the falling edge of the read clock signal, and the retimed data bits corresponding to the memory data bits of a second group of the memory cells may be provided from the first shift register that samples the output of the sense amplifier in response to the falling edge of the read clock signal, where the first group of the memory cells is disposed farthest away from the sense amplifier among the plurality of memory cells, where the third group of the memory cells is disposed closest to the sense amplifier among the plurality of memory cells, and where the second group of the memory cells is disposed between the first group and the third group.

The dummy memory cells may include read only memory (ROM) cells and the patterned data bits may be stored in the ROM cells.

The dummy memory cells may include one of random access memory (RAM) cells, latches and flip-flops and the patterned data bits may be written in the dummy memory cells based on data provided from an external device.

According to example embodiments, an image sensor includes a pixel array including a plurality of pixels configured to capture an image, an analog-to-digital convertor block configured to convert analog signals from the pixels to digital signals, and a line memory device configured to buffer the digital signals as memory data bits. The line memory device includes a plurality of memory cells, a data line pair, a sense amplifier and an output unit. The plurality of memory cells are disposed adjacent to each other in a line. The data line pair is coupled to the memory cells to sequentially transfer to the sense amplifier the memory data bits stored in the memory cells. The sense amplifier is configured to amplify the memory data bits that are sequentially transferred through the data line pair by delay times which are different from each other. The output unit samples an output of the sense amplifier to sequentially output retimed data bits of the memory data bits in response to a read clock signal. The read clock signal has a cyclic period which is less than a maximum delay time among the delay times.

The output unit may sample the output of the sense amplifier in response to a first edge of the read clock signal to output first bits of the retimed data bits, and sample the output of the sense amplifier in response to a second edge of the read clock signal to output second bits of the retimed data bits. The first edge corresponds to one of a rising edge and a falling edge, and the second edge corresponds to the other of the rising edge and the falling edge.

The first bits of the retimed data bits may correspond to the memory data bits of first and third groups of the memory cells, and the second bits of the retimed data bits may correspond to the memory data bits of a second group of the memory cells, where the first group of the memory cells is disposed farthest away from the sense amplifier among the plurality of memory cells, the third group of the memory cells is disposed closest to the sense amplifier among the plurality of memory cells, and the second group of the memory cells is disposed between the first group and the third group.

The output unit may include a first shift register configured to sample the output of the sense amplifier in response to a first edge of the read clock signal, the first edge corresponding to one of a rising edge and a falling edge; a second shift register configured to sample the output of the sense amplifier in response to a second edge of the read clock signal, the second edge corresponding to the other of the rising edge and the falling edge; a multiplexer configured to select one of an output of the first shift register and an output of the second shift register in response to a selection signal; and a retiming control block configured to generate the selection signal based on the delay times.

The retiming control block may include a detector configured to detect at least one retiming point based on the delay times which are different from each other; and a selection signal generator configured to generate the selection signal based on the retiming point.

The detector may include a plurality of dummy memory cells disposed adjacent to each other in a line; a dummy data line pair coupled to the dummy memory cells to sequentially transfer patterned data bits stored in the dummy memory cells; a dummy sense amplifier coupled to the dummy data line pair to sense and amplify the patterned data bits that are sequentially transferred through the dummy data line pair with corresponding dummy delay times which are different from each other, a connection of the dummy data line pair to the dummy memory cells and the dummy sense amplifier being substantially the same as a connection of the data line pair to the memory cells and the sense amplifier so that each of the dummy delay times is substantially the same as a corresponding one of the delay times; and a detection signal generator configured to generate a detection signal by comparing first detection data bits and second detection data bits sampled from an output of the dummy sense amplifier, the detection signal indicating the retiming point, the first detection data bits being in response to the first edge of the read clock signal, and the second detection data bits being sampled in response to the second edge of the read clock signal.

According to example embodiments, a device comprises: a plurality of memory cells each configured to stored a corresponding memory data bit; a sense amplifier; a data line pair coupled to the memory cells and to the sense amplifier to sequentially transfer the memory data bits from the memory cells to the sense amplifier, wherein each of the plurality of memory cells has a corresponding distance to the sense amplifier along the data line pair such that each memory data bit is transferred from its corresponding memory cell to the sense amplifier with a corresponding delay, wherein the delays for the memory data bits are all different from each other, and wherein a first one of the memory cells has a farthest distance among the memory cells to the sense amplifier along the data line pair and stores a corresponding first data bit which is transferred to the sense amplifier with a longest delay among the delays; and an output unit configured to sample an output of the sense amplifier for each of the memory data bits in response to a read clock signal so as to sequentially output retimed data bits each corresponding to one of the memory data bits, wherein the read clock signal has a cyclic period which is less than the longest delay time.

The memory data bits may be sequentially transferred to the sense amplifier in order beginning with the first one of the memory cells and ending with a last one of the memory cells, wherein the last one of the memory cells has a shortest distance among the memory cells to the sense amplifier along the data line pair.

The memory data bits may be sequentially transferred to the sense amplifier in order beginning with a last one of the memory cells and ending with the first one of the memory cells, wherein the last one of the memory cells has a shortest distance among the memory cells to the sense amplifier along the data line pair.

The output unit may comprise: a first shift register comprising a first plurality of flip-flops cascaded in series configured to sample the output of the sense amplifier in response to a first edge of the read clock signal, the first edge corresponding to one of a rising edge and a falling edge; a second shift register comprising a second plurality of flip-flops cascaded in series configured to sample the output of the sense amplifier in response to a second edge of the read clock signal, the second edge corresponding to the other of the rising edge and the falling edge; a multiplexer configured to select one of an output of the first shift register and an output of the second shift register in response to a retiming selection signal; and a retiming control block configured to generate the retiming selection signal based on the delay times.

The device of may further comprise: a pixel array including a plurality of pixels configured to capture an image; and an analog-to-digital convertor block configured to convert analog signals from the pixels to digital signals, wherein the plurality of memory cells is configured to buffer the digital signals as the memory data bits.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
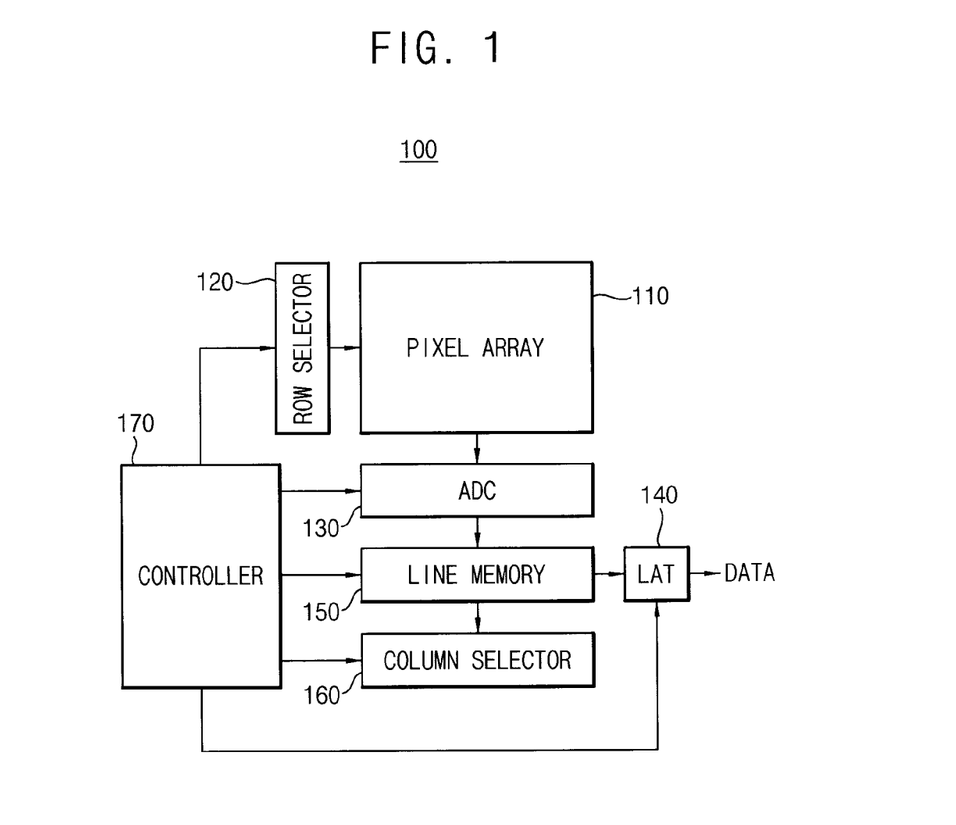
FIG. 1 is a block diagram illustrating an image sensor according to example embodiments.

FIG. 1 is a block diagram illustrating an image sensor 100 according to example embodiments.

Referring to FIG. 1, image sensor 100 may include a pixel array 110, a row selector 120, an analog-to-digital convertor (ADC) block 130, a line memory device 150, a column selector 160, an output latch (LAT) 140 and a controller 170.

Pixel array 110 may include a plurality of pixels for capturing an image. For example, pixel array 110 may include active pixels arranged in a matrix form of rows and columns. Each active pixel may include a photodiode for sensing photo-charge generated by incident light and at least one switch element such as a CMOS transistor for controlling an output of an analog signal indicating the amount of the sensed photo-charge. Row selector 120 may select one row of pixel array 110 in response to a control signal provided from controller 170. ADC block 130 may convert the analog signals from the pixels to digital signals. ADC block 130 may include a plurality of ADCs, a sample and hold circuit, a correlated double sampling circuit, a gain-controlled offset compensation circuit, etc.

Line memory device 150 buffers the digital signals as memory data bits. As described below with reference to FIGS. 2 through 10, line memory device 150 may include a plurality of memory cells, a data line pair, a sense amplifier and an output unit. According to example embodiments, line memory device 150 may be operated using a read clock signal having a cyclic period which is less than a maximum delay time of data bits transferred from the memory cells to the sense amplifier through the data line pair, and thus an operational speed of line memory device 150 may be increased by increasing the frequency of the read clock signal.

Column selector 160 may select one column of pixel array 110 in response to a control signal provided from controller 170. Output latch 140 latches an output of line memory device 150 and outputs the latched data to an external device.

Figure 2:
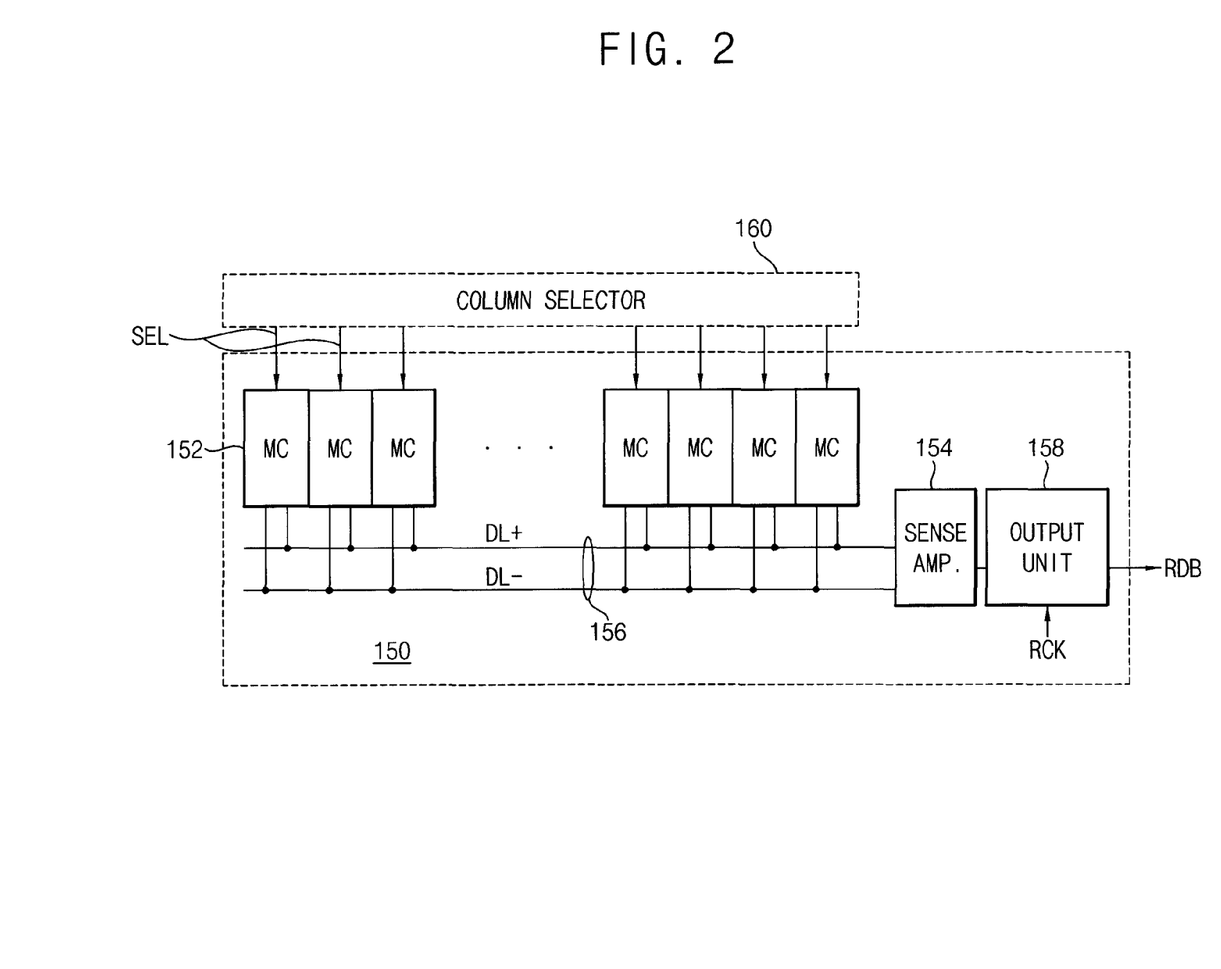
FIG. 2 is a block diagram illustrating a line memory device according to example embodiments.

FIG. 2 is a block diagram illustrating a line memory device 150 according to example embodiments.

Referring to FIG. 2, line memory device 150 may include a plurality of memory cells (MCs) 152, a sense amplifier 154, a data line pair 156 and an output unit 158.

Memory cells 152 are disposed adjacent to each other in a line. For example, memory cells 152 may be static random access memory (SRAM) cells. The number of memory cells 152 may be determined according to the digital bit number of ADC block 130. For example, eight memory cells may be disposed in the line when ADC block 130 includes 8-bit converters, or ten memory cells may be disposed in the line when ADC block 130 includes 10-bit converters. Data line pair 156 is coupled to memory cells 152 to sequentially transfer memory data bits stored in memory cells 152. As illustrated in FIG. 2, data line pair 156 may include a positive line DL+ and a negative line DL− to transfer a differential signal. Sense amplifier 154 is coupled to the data line pair 156 to sense and amplify the memory data bits that are sequentially transferred through data line pair 156 by respective delay times which are different from each other. For example, the delay time associated with transferring data from the left-most memory cell of memory cells 152 shown in FIG. 2 to sense amplifier 154 via data line pair 156 may be larger than the delay time associated with transferring data from the right-most memory cell of memory cells 152 shown in FIG. 2 to sense amplifier 154 via data line pair 156. The different delay times are caused because the transfer distances from respective memory cells 152 to sense amplifier 154 are different from each other. Column selector 160 may provide selection signals SELs that are sequentially activated so that memory cells 152 may sequentially output the respective memory data bits. Output unit 158 samples an output of sense amplifier 154 to sequentially output retimed data bits RDB of the memory data bits in response to a read clock signal RCK. Through a retiming operation as described below, the read clock signal RCK may have a cyclic period which is less than a maximum delay time among the delay times associated with the various memory cells 152.

Figure 3:
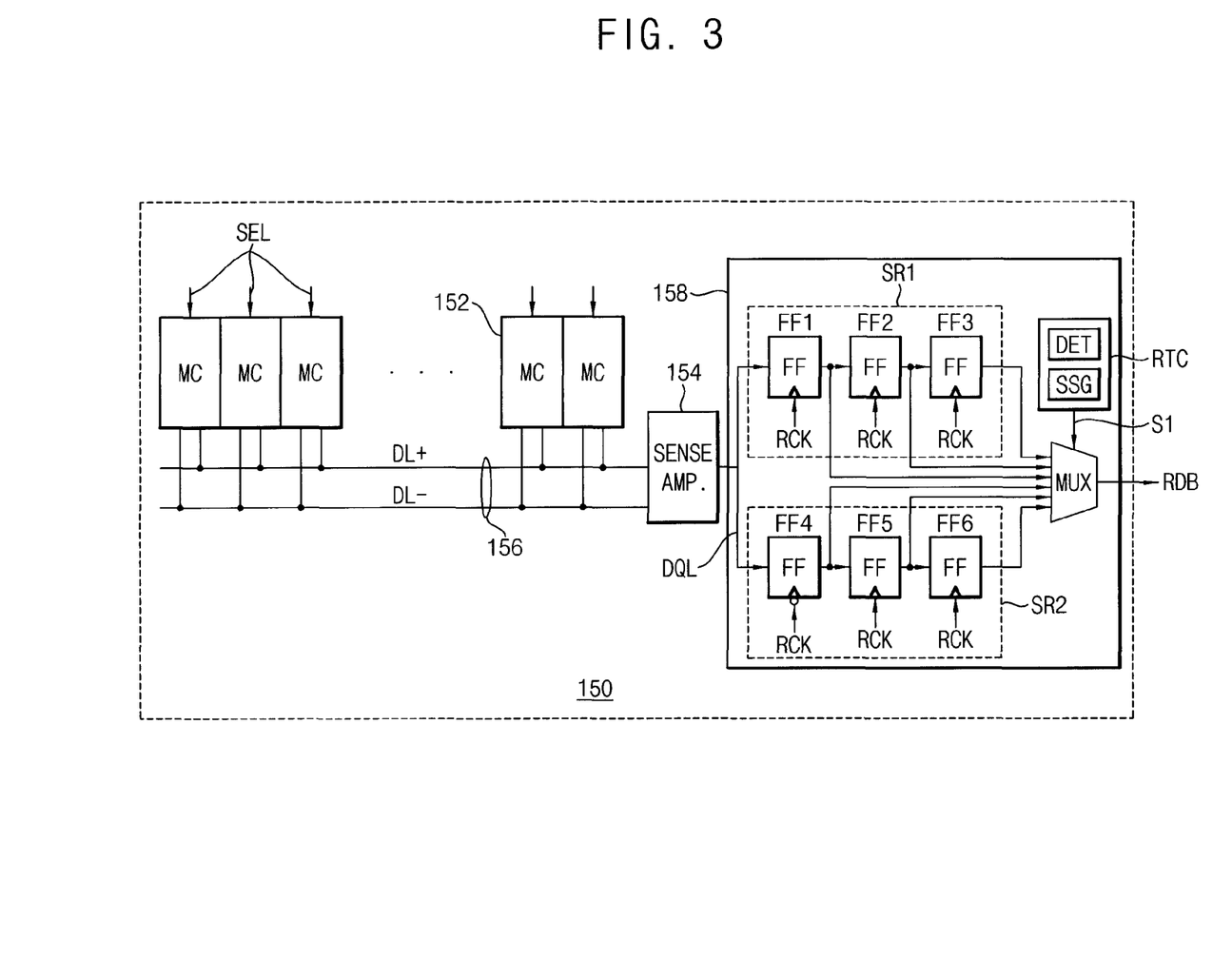
FIG. 3 is a circuit diagram illustrating an output unit included in a line memory device according to example embodiments.

FIG. 3 is a circuit diagram illustrating an output unit 158 included in a line memory device according to example embodiments.

Referring to FIG. 3, output unit 158 may include a first shift register SR1, a second shift register SR2, a multiplexer MUX and a retiming control block RTC. For convenience of description, other elements in line memory device 150 are illustrated also in FIG. 3.

The first shift register SR1 may sample the output DQL of sense amplifier 154, that is, the sensed data bits DQL, in response to a first edge of the read clock signal RCK where the first edge corresponds to a rising edge or a falling edge. The first shift register SR1 may include a plurality of flip-flops FF1, FF2 and FF3 that are connected so as to be cascaded together to perform a shift operation. FIG. 3 illustrates an example wherein the first edge corresponds to the rising edge of the read clock signal RCK and the first flip-flop of the cascaded series of flip-flops in first shift register SR1, FF1, samples the output DQL of sense amplifier 154 in response to the rising edge of the read clock signal RCK.

Second shift register SR2 may sample the output DQL of sense amplifier 154 in response to a second edge of the read clock signal RCK where the second edge corresponds to the other of the rising edge and the falling edge. The second shift register SR2 may include a plurality of flip-flops FF4, FF5 and FF6 that are connected so as to be cascaded together to perform a shift operation. FIG. 3 illustrates an example wherein the second edge corresponds to the falling edge of the read clock signal RCK and the first front flip-flop of the cascaded series of flip-flops in second shift register SR2, FF4, samples the output DQL of sense amplifier 154 in response to the falling edge of the read clock signal RCK.

Multiplexer MUX may select one of an output of first shift register SR1 and an output of second shift register SR2 in response to a retiming selection signal S1. Retiming control block RTC may generate the retiming selection signal S1 based on the different delay times. For example, the output of first shift register SR1 may include the outputs of the flip-flops FF1, FF2 and FF3 and the output of second shift register SR2 may include the outputs of the flip-flops FF4, FF5 and FF6. Accordingly multiplexer MUX may select one of the outputs of the flip-flops FF1 through FF6 in response to the retiming selection signal S1.

Retiming control block RTC may includes a detector DET and a selection signal generator SSG. Detector DET may detect at least one retiming point based on the delay times different from each other. An example embodiment of detector DET is further described with reference to FIG. 4. Selection signal generator SSG may generate the retiming selection signal S1 based on the retiming point detected by detector DET.

Figure 4:
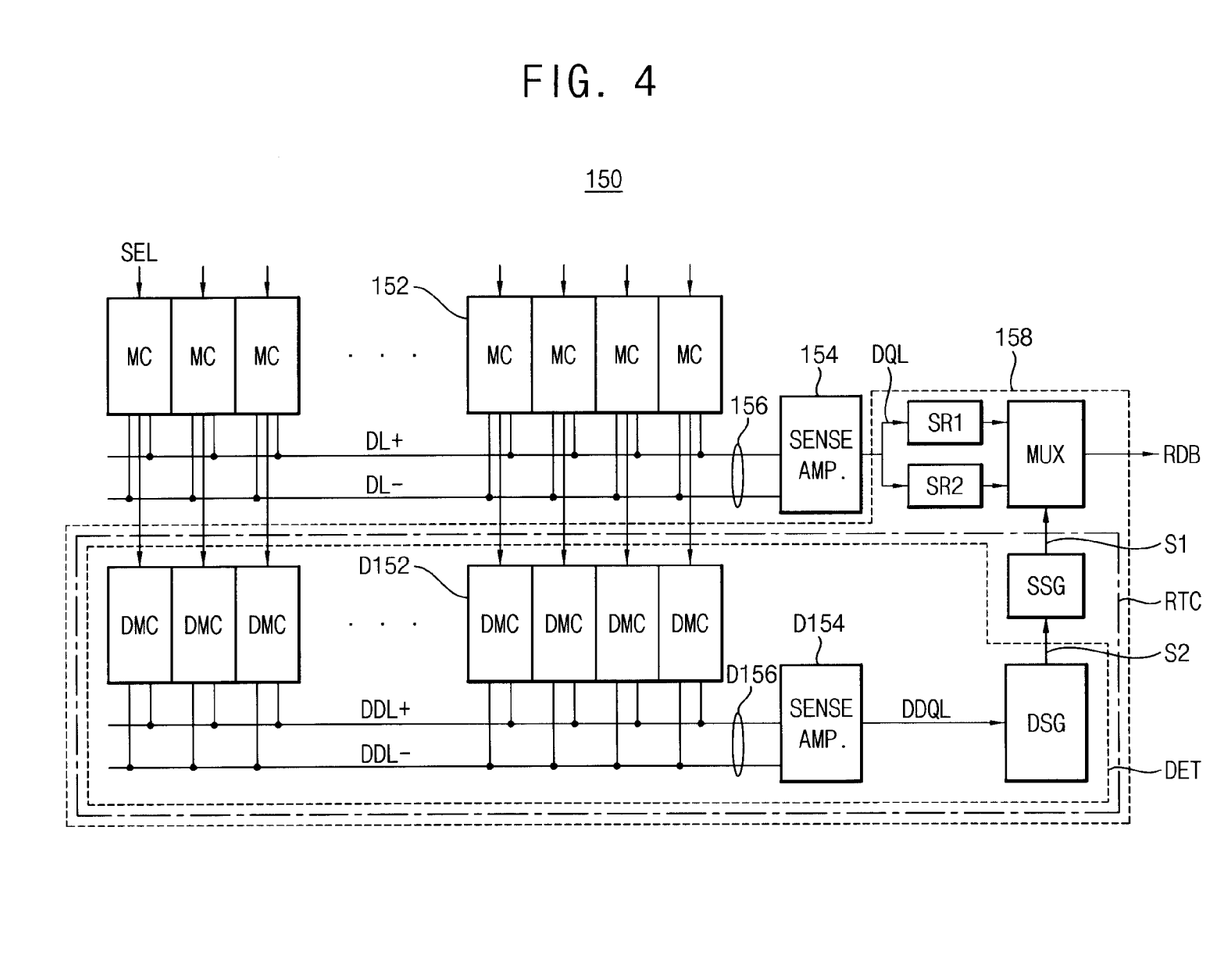
FIG. 4 is a circuit diagram illustrating a detector included in a line memory device according to example embodiments.

FIG. 4 is a circuit diagram illustrating a detector included in a line memory device according to example embodiments.

Referring to FIG. 4, detector DET may include a plurality of dummy memory cells (DMCs) D152, a dummy sense amplifier D154, a dummy data line pair D156 and a detection signal generator DSG. For convenience of description, other elements in line memory device 150 are illustrated also in FIG. 4.

Dummy memory cells D152 are disposed adjacent to each other in a line. Dummy data line pair D156 is coupled to dummy memory cells D152 to sequentially transfer patterned data bits stored in dummy memory cells D152. Dummy data line pair D156 may include a positive line DDL+ and a negative line DDL− to transfer a differential signal. In some embodiments, dummy memory cells D152 may include read only memory (ROM) cells. In this case, the patterned data bits may be stored in the ROM cells in advance. In other embodiments, the dummy memory cells D152 may include random access memory (RAM) cells, latches and/or flip-flops. In this case, the patterned data bits may be written in the dummy memory cells based on data provided from an external device and the patterned data bits may be variously determined.

Dummy sense amplifier D154 is coupled to dummy data line pair D156 to sense and amplify the patterned data bits that are sequentially transferred through dummy data line pair D156 by dummy delay times different from each other. A connection of dummy data line pair D156 to dummy memory cells D152 and dummy sense amplifier D154 may be substantially the same as a connection of data line pair 156 to memory cells 152 and sense amplifier 154 so that the dummy delay times through dummy data line pair D156 may be substantially the same as the delay times through data line pair 156. The delay characteristics through dummy data line pair D156 may be substantially the same as the delay characteristics through data line pair 156 by adopting the same structure and the same manufacturing process.

Detection signal generator DSG may be configured to generate a detection signal S2 by comparing first detection data bits and second detection data bits sampled from an output DDQL of dummy sense amplifier D154, as further described below with reference to FIGS. 9 and 10, and the detection signal S2 may indicate the retiming point. The first detection data bits may be sampled in response to the first edge of the read clock signal RCK and the second detection data bits may be sampled in response to the second edge of the read clock signal RCK.

Hereinafter, the operations of the line memory device according to example embodiments are described with reference to FIGS. 5 through 10.

Figure 5:
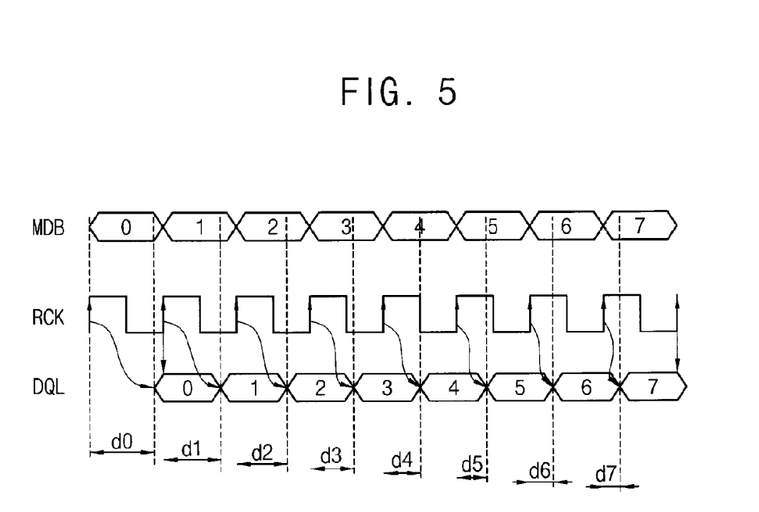
FIGS. 5 and 6 are timing diagrams for describing delay times in a line memory device.
Figure 6:
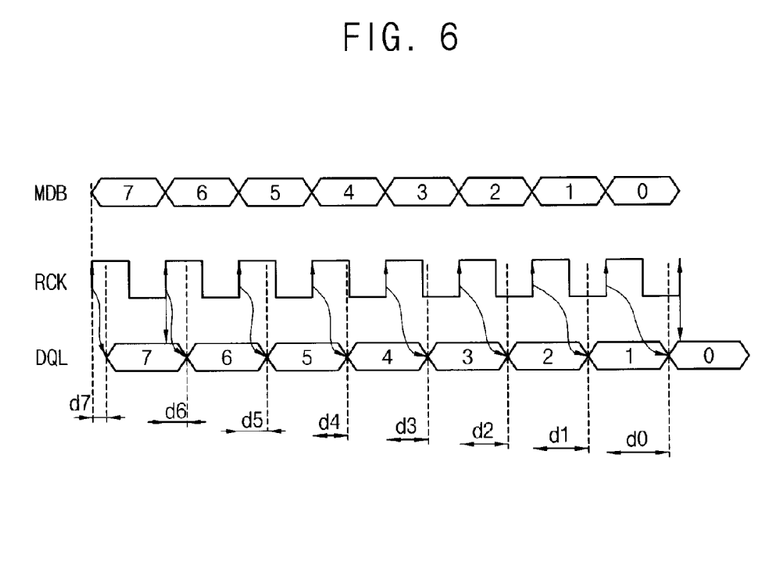

FIGS. 5 and 6 are timing diagrams for describing delay times in a line memory device. For convenience, FIGS. 5 and 6 illustrate examples when line memory device 150 of FIG. 2 includes the eight memory cells 152. Bit numbers 0 through 7 may be numbered in the reverse order of the distances of the respective memory cells with respect to the sense amplifier 154. In other words, the bit number 0 corresponds to the memory cell physically located farthest away from the sense amplifier 154 and the bit number 7 corresponds to the memory cell physically located closest to the sense amplifier 154.

FIG. 5 illustrates the delay characteristic when the memory data bits MDB are sequentially output from memory cells 152 to data line pair 156 in order from the memory cell (data bit 0) farthest away from sense amplifier 154 being output first, to the memory cell (data bit 7) closest to sense amplifier 154 being output last. The delay times d0 through d7 may be defined as time intervals between output timings of the respective memory data bits MDB 0~7 from respective memory cells 152, and output timings of sensed data bits DQL 0~7 from sense amplifier 154. Data line pair 156 has a parasitic capacitance and resistance, which are a function of length, and thus the delay times d0 through d7 are substantially proportional to the respective transfer lengths. As illustrated in FIG. 5, the memory data bits MDB are transferred through data line pair 156 to sense amplifier 154 by the delay times d0 through d7, where the data bit 0 has the maximum delay time and the data bit 7 has the minimum delay time. As a result, the frequency of the sensed data bits DQL from sense amplifier 154 is greater than the access frequency to the memory cells 152, that is, the frequency of the read clock signal RCK.

Such delay characteristic limits the reading speed of line memory device 150, that is, the frequency of read clock signal RCK. As shown in FIG. 5, when the sensed data bits DQL are sampled in response to the rising edge of the read clock signal RCK, the rising edge has to be aligned to the front portion of the data bit 0 and the rear portion of the data bit 7. In other words, the cyclic period of the read clock signal RCK is limited to be greater than the maximum delay time d0.

FIG. 6 illustrates the delay characteristic when the memory data bits MDB are sequentially output from memory cells 152 to data line pair 156 in reverse order from the closest memory cell (data bit 7) to sense amplifier 154 being output first, to the farthest memory cell (data bit 0) from sense amplifier 154 being output last. As shown in FIG. 6, when the sensed data bits DQL are sampled in response to the rising edge of the read clock signal RCK, the rising edge has to be aligned to the rear portion of the data bit 7 and the front portion of the data bit 0. As in the case of FIG. 5, the cyclic period of the read clock signal RCK is limited to be greater than the maximum delay time d0.

As a result, the sampling edge may not be aligned properly if the sensed data bits DQL are sampled with a read clock signal RCK which has a cyclic period less than the maximum delay time d0. So unless other measures are employed, this would limit the maximum operating speed of the line memory device.

Figure 7:
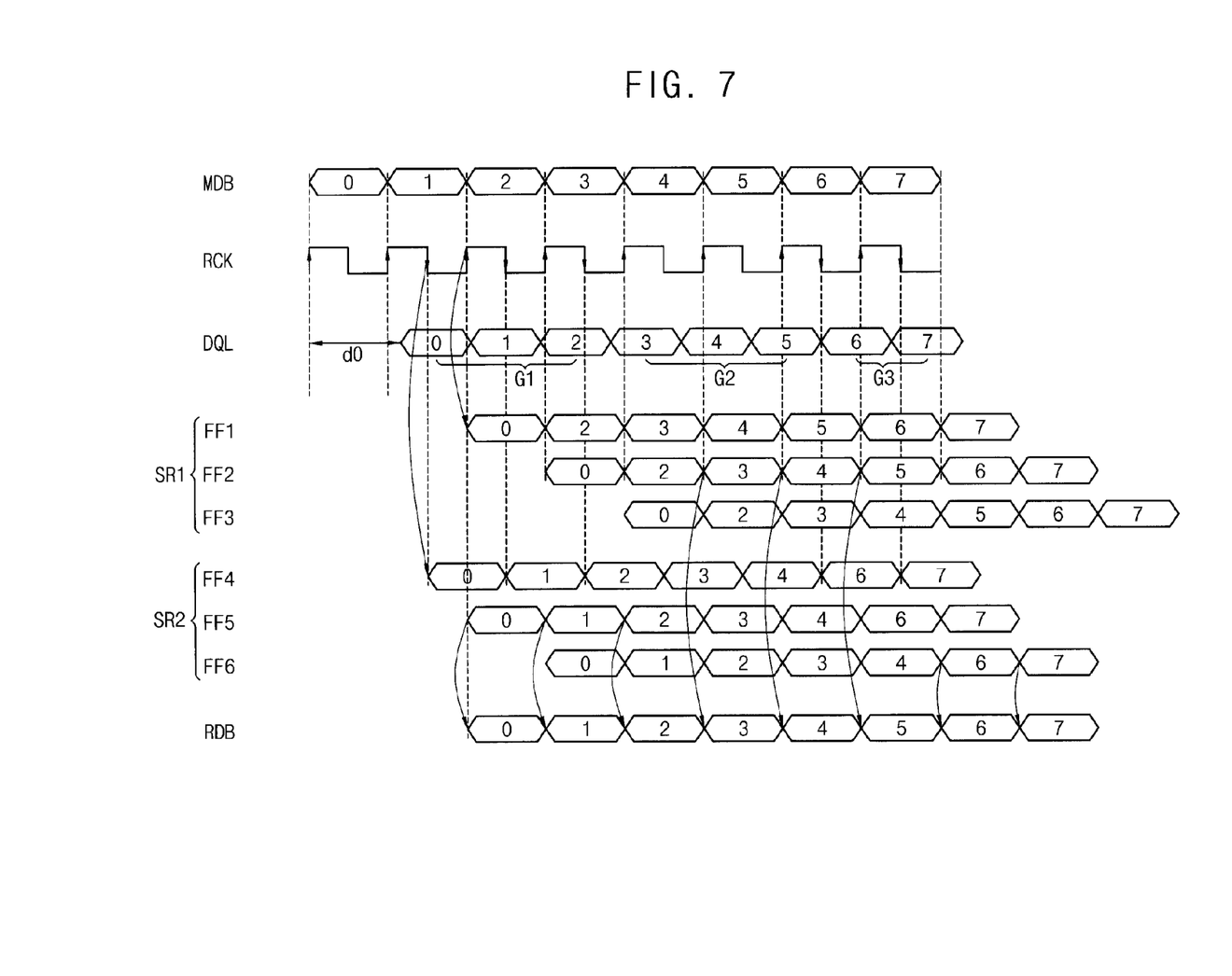
FIGS. 7 and 8 are timing diagrams illustrating examples of a retiming operation in a line memory device according to example embodiments.
Figure 8:
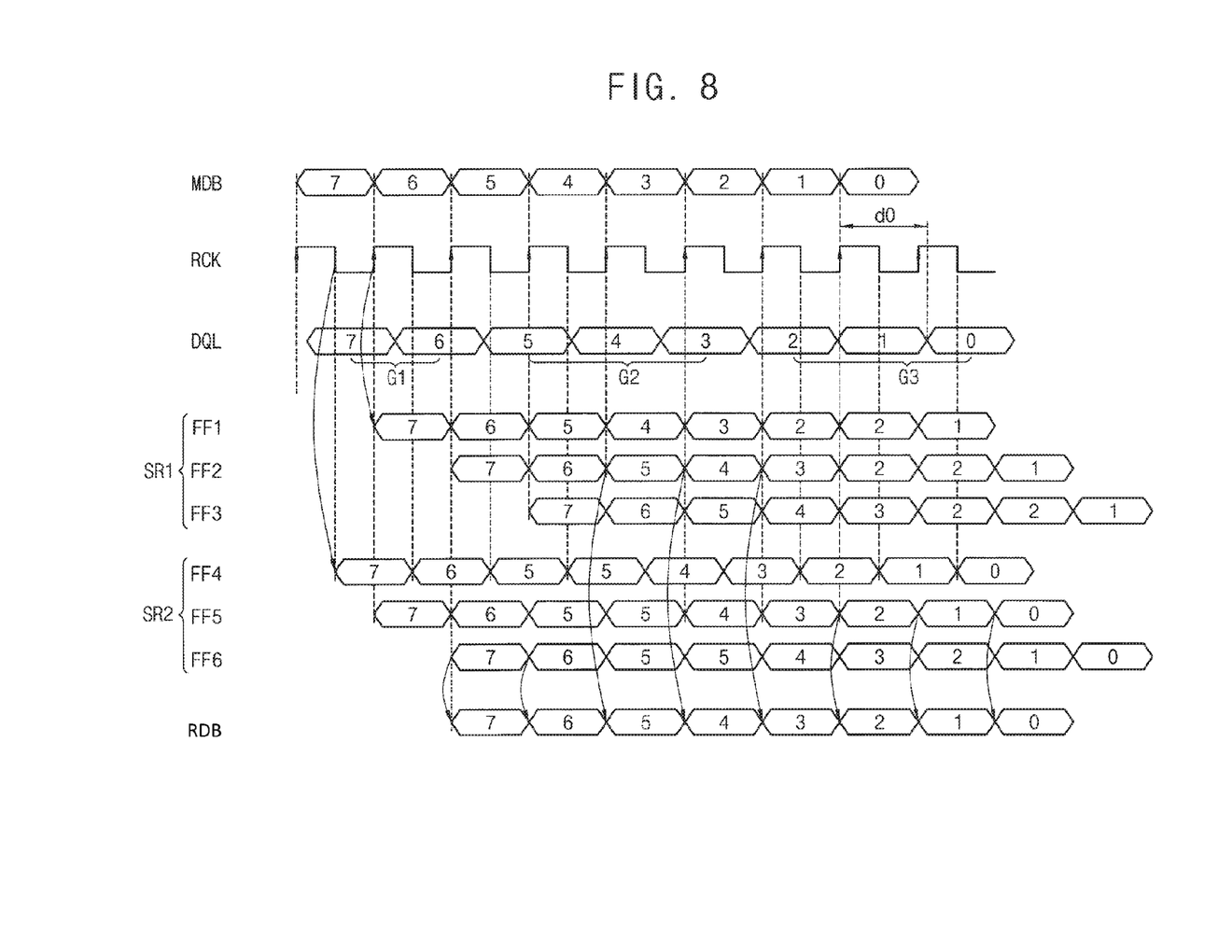

FIGS. 7 and 8 are timing diagrams illustrating examples of a retiming operation in a line memory device according to example embodiments. In FIGS. 7 and 8, MDB represents the memory data bits output from memory cells 152, RCK represents the read clock signal, DQL represents the sensed data bits out from sense amplifier 154, FF1 through FF6 represent the data bits output from the flip-flops in the first and second shift registers SR1 and SR2, and RDB represents the retimed data bits output from output unit 158.

FIG. 7 illustrates the delay characteristic when the memory data bits MDB are sequentially output from memory cells 152 to data line pair 156 in order from the farthest memory cell (data bit 0) from sense amplifier 154 being output first, to the closest memory cell (data bit 7) to sense amplifier 154 being output last.

Referring to FIGS. 3 and 7, the cyclic period of the read clock signal RCK may be less than the maximum delay time d0 to increase the operational speed of line memory device 150. As illustrated in FIG. 3, the first flip-flop FF4 of second shift register SR2 may sample the sensed data bits DQL in response to the falling edge of the read clock signal RCK, and the first flip-flop FF1 of first shift register SR1 may sample the sensed data bits DQL in response to the rising edge of the read clock signal RCK. The following flip-flops FF2, FF3, FF5 and FF6 may sequentially latch the output of the previous flip-flop in response to the rising edge of the read clock signal RCK. As mentioned above, multiplexer MUX may select one of the output of first shift register SR1 and the output of second shift register SR in response to the retiming selection signal S1. As shown in FIG. 7, the sampling edge among the rising edge and the falling edge may be determined properly with respect to each of the data bits 0 through 7. The output of flip-flop FF5 of second shift register SR2 may be selected and output as the data bits 0, 1 and 2 of the retimed data bits RDB, the output of flip-flop FF2 of first shift register SR1 may be selected and output as the data bits 3, 4 and 5 of the retimed data bits RDB, and the output of flip-flop FF6 of second shift register SR2 may be selected and output as the data bits 6 and 7 of the retimed data bits RDB.

In other words, the stable retimed data bits RDB may be output by selecting the output of flip-flop FF5 as the retimed data bits 0, 1 and 2 corresponding to the memory data bits 0, 1 and 2 of a first group G1, selecting the output of flip-flop FF2 as the retimed data bits 3, 4 and 5 corresponding to the memory data bits 3, 4 and 5 of a second group G2 and selecting the output of the flip-flop FF6 as the retimed data bits 6 and 7 corresponding to the memory data bits 6 and 7 of a third group G3. Here, the first group of the memory cells is disposed farthest away from sense amplifier 154, the third group of the memory cells is disposed closest to sense amplifier 154, and the second group of the memory cells is disposed between the first group and the third group.

FIG. 8 illustrates the delay characteristic when the memory data bits MDB are sequentially output from memory cells 152 to data line pair 156 in reverse order from the closest memory cell (data bit 7) to sense amplifier 154 being output first, to the memory cell (data bit 0) farthest away from sense amplifier 154 being output last.

Referring to FIGS. 3 and 8, the cyclic period of the read clock signal RCK may be less than the maximum delay time d0 to increase the operational speed of line memory device 150. As illustrated in FIG. 3, the first flip-flop FF4 of second shift register SR2 may sample the sensed data bits DQL in response to the falling edge of the read clock signal RCK and the first flip-flop FF1 of first shift register SR1 may sample the sensed data bits DQL in response to the rising edge of the read clock signal RCK. The following flip-flops FF2, FF3, FF5 and FF6 may sequentially latch the output of the previous flip-flop in response to the rising edge of the read clock signal RCK. As mentioned above, multiplexer MUX may select one of the output of first shift register SR1 and the output of second shift register SR2 in response to the retiming selection signal S1. As shown in FIG. 8, sampling edge among the rising edge and the falling edge may be determined properly with respect to each of the data bits 0 through 7. The output of flip-flop FF6 of second shift register SR2 may be selected and output as the data bits 7 and 6 of the retimed data bits RDB, the output of flip-flop FF2 of the first shift register SR1 may be selected and output as the data bits 5, 4 and 3 of the retimed data bits RDB, and the output of flip-flop FF5 of the second shift register SR2 may be selected and output as the data bits 2, 1 and 0 of the retimed data bits RDB.

In other words, the stable retimed data bits RDB may be output by selecting the output of flip-flop FF6 as the retimed data bits 7 and 6 corresponding to the memory data bits 7 and 6 of a first group G1, selecting the output of flip-flop FF2 as the retimed data bits 5, 4 and 3 corresponding to the memory data bits 5, 4 and 3 of a second group G2 and selecting the output of flip-flop FF5 as the retimed data bits 2, 1 and 0 corresponding to the memory data bits 2, 1 and 0 of a third group G3. Here, the first group of the memory cells is disposed farthest away from sense amplifier 154, the third group of the memory cells is disposed closest to sense amplifier 154, and the second group of the memory cells is disposed between the first group and the third group.

As such, output unit 158 may sample the output of sense amplifier 154 in response to a first edge of the read clock signal RCK to output first bits of the retimed data bits and sample the output of sense amplifier 154 in response to a second edge of the read clock signal to output second bits of the retimed data bits. Here the first edge corresponds to one of a rising edge and a falling edge and the second edge corresponds to the other of the rising edge and the falling edge.

The first bits of the retimed data bits may correspond to the memory data bits of first and third group G1 and G3 of the memory cells and the second bits of the retimed data bits correspond to the memory data bits of a second group G2 of the memory cells. Here the first group G1 of the memory cells is disposed farthest away from sense amplifier 154, the third group G3 of the memory cells is disposed closest to sense amplifier 154, and the second group G2 of the memory cells is disposed between the first group G1 and the third group G3.

As such, through the retiming operation for selecting the proper outputs of shift registers SR1 and SR2 as the respective retimed data bits RDB, the read clock signal RCK having a cyclic period less than the maximum delay time d0 may be used to increase the operational speed of line memory device 150.

To perform the above-described retiming operation, the retiming control block RTC in FIGS. 3 and 4 provides the retiming control signal S1 that is matched with the delay times d0 through d7 between memory cells 152 and sense amplifier 154 coupled through data line pair 156. However, the delay characteristic may be variously changed depending on conditions of manufacturing process, operational conditions, noises, etc.

Accordingly, in example embodiments, the exact retiming point reflecting the real delay characteristic may be obtained using dummy memory cells D152, dummy sense amplifier D154 and dummy data line pair D156 as illustrated in FIG. 4.

Figure 9:
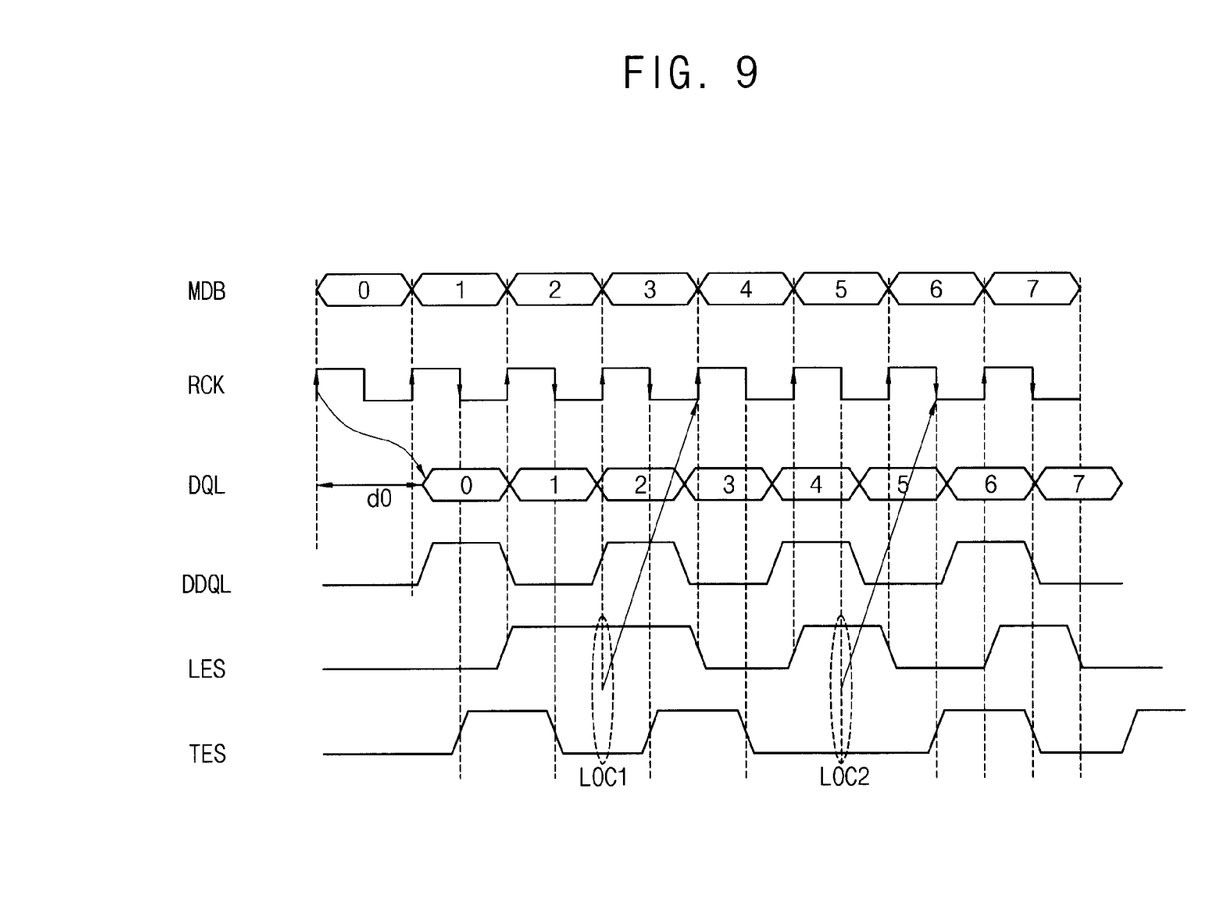
FIGS. 9 and 10 are timing diagrams illustrating examples of an operation of a detector included in a line memory device according to example embodiments.
Figure 10:
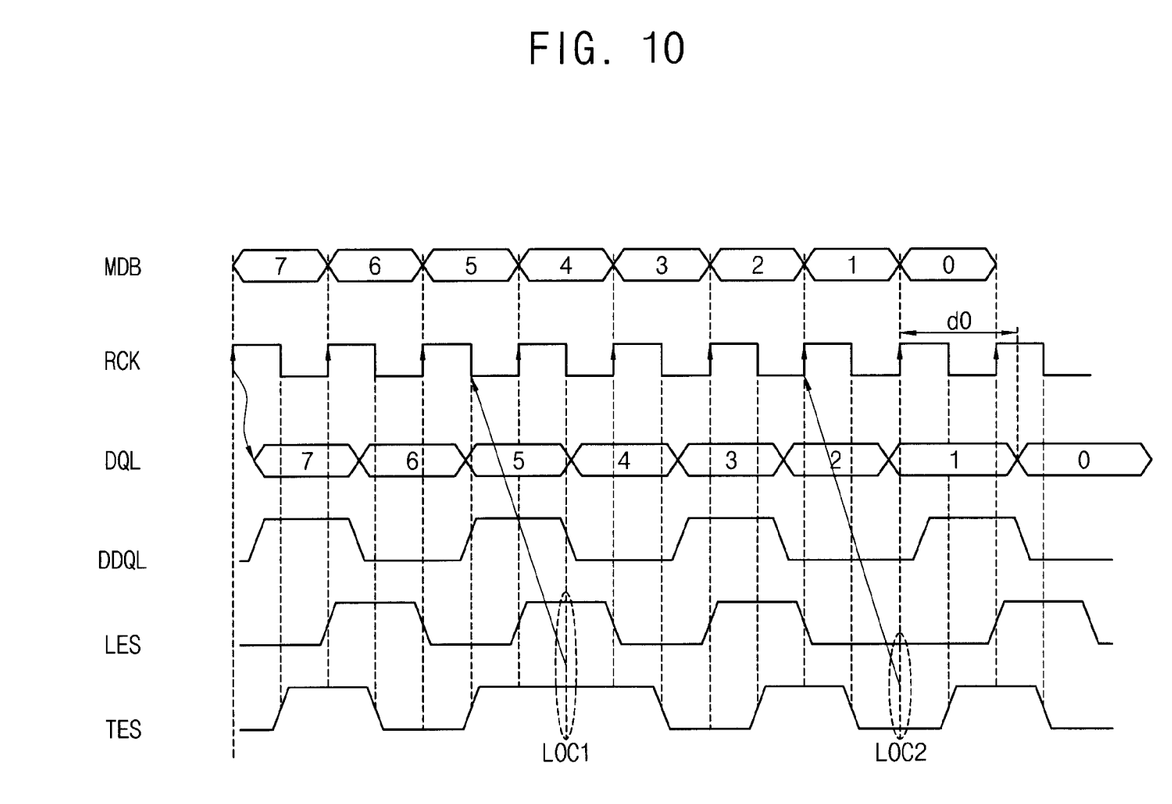

FIGS. 9 and 10 are timing diagrams illustrating examples of an operation of a detector included in a line memory device according to example embodiments.

FIG. 9 illustrates the delay characteristic when the memory data bits MDB are sequentially output from memory cells 152 to data line pair 156 in order from the farthest memory cell away from sense amplifier being output first, to the closest memory cell to sense amplifier 154 being output last. FIG. 10 illustrates the delay characteristic when the memory data bits MDB are sequentially output from memory cells 152 to data line pair 156 in reverse order from the nearest memory cell to the farthest memory cell.

In FIGS. 9 and 10, MDB represents the memory data bits output from memory cells 152, RCK represents the read clock signal, DQL represents the sensed data bits out from the sense amplifier 154, and DDQL represents the dummy sensed data bits out from the dummy sense amplifier D154

Detection signal generator DSG in FIG. 4 generates internally first detection data bits LES and second detection data bits TES. The first detection data bits LES may be sampled from the dummy sensed data bits DDQL in response to the rising edge of the read clock signal RCK, and the second detection data bits TES may be sampled from the dummy sensed data bits DDQL in response to the second edge of the read clock signal. Detection signal generator DSG may generate the detection signal S2 by comparing the first detection data bits LES and the second detection data bits TES. The detection signal S2 may indicate the retiming points LOC1 and LOC2 when the change of the sampling edge is required between the rising edge and the falling edge of the read clock signal RCK. Selection signal generator SSG may generate the retiming selection signal S1 based on the retiming points LOC1 and LOC2 provided by the detection signal S2 of detection signal generator DSG.

In case of FIG. 10, the retiming positions LOC1 and LOC2 may be detected after one clock cycle. In this case, detector DET in FIG. 4 may be operated in advance to generate the detection signal S2 indicating the retiming positions LOC1 and LOC2, and then the retiming operation based on the retiming selection signal S1 may be performed.

Dummy memory cells D152 in FIG. 4 may be implemented with various memory cells such as read only memory (ROM) cells, random access memory (RAM) cells, latches and flip-flops.

When dummy memory cells D152 include read only memory (ROM) cells, then the patterned data bits which are fixed pattern data bits may be stored in the ROM cells. When dummy memory cells D152 include one of random access memory (RAM) cells, latches and flip-flops, the patterned data bits may be written in the dummy memory cells based on data provided from an external device.

The patterned data bits stored in dummy memory cells D152 may be determined variously. As illustrated in the dummy sensed data bits DDQL of FIGS. 9 and 10, the patterned data bits may be "101010 . . . ". If a clock signal having a frequency different from the read clock signal RCK is used to detect the retiming positions, different patterned data bits such as "11001100 . . . " may be stored in the dummy memory cells D152.

Even though the embodiments are described in which all of memory cells 152 in line memory device 150 are read out sequentially, some bits may be not be read out according to the operation of line memory device 150. The image sensor including line memory device 150 may capture an image with reduced resolution. For example, only the data in the odd-numbered memory cells or only the data in the even-numbered memory cells may be valid image data. In this case, the proper patterned data bits such as "11001100 . . . " may be stored in dummy memory cells D152 to find the exact retiming points.

The foregoing is illustrative of example embodiments and is not to be construed as limiting thereof. Although a few example embodiments have been described, those skilled in the art will readily appreciate that many modifications are possible in the exemplary embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A line memory device, comprising:
    a plurality of memory cells each configured to store a respective different memory data bit from among memory data bits;
    a sense amplifier;
    a data line pair coupled to the memory cells and to the sense amplifier to sequentially transfer the memory data bits from the memory cells to the sense amplifier, wherein each of the plurality of memory cells is disposed a corresponding different distance from the sense amplifier along the data line pair such that the memory data bits are transferred from the memory cells to the sense amplifier with delays that are different from each other, and wherein a first one of the memory cells is a farthest distance among the memory cells from the sense amplifier along the data line pair and stores a first data bit from among the memory data bits which is transferred to the sense amplifier with a longest delay among the delays; and
    an output unit configured to sample an output of the sense amplifier for each of the memory data bits in response to a read clock signal so as to sequentially output retimed data bits each corresponding to a respective different one of the memory data bits,
    wherein the read clock signal has a cyclic period which is less than the longest delay.

2. The line memory device of claim 1, wherein the memory data bits are sequentially transferred to the sense amplifier in order beginning from the first one of the memory cells and ending with a last one of the memory cells, wherein the last one of the memory cells is a shortest distance among the memory cells from the sense amplifier along the data line pair.

3. The line memory device of claim 1, wherein the memory data bits are sequentially transferred to the sense amplifier in order beginning from a last one of the memory cells and ending with the first one of the memory cells, wherein the last one of the memory cells is a shortest distance among the memory cells from the sense amplifier along the data line pair.

4. The line memory device of claim 1, wherein the output unit is configured to sample the output of the sense amplifier in response to a first edge of the read clock signal to output first bits of the retimed data bits, and to sample the output of the sense amplifier in response to a second edge of the read clock signal to output second bits of the retimed data bits, the first edge corresponding to one of a rising edge and a falling edge, and the second edge corresponding to an other of the rising edge and the falling edge.

5. The line memory device of claim 4, wherein the first bits of the retimed data bits correspond to the memory data bits of first and third groups of the memory cells, and the second bits of the retimed data bits correspond to the memory data bits of a second group of the memory cells, the first group of the memory cells disposed farthest away from the sense amplifier among the plurality of memory cells, the third group of the memory cells disposed closest to the sense amplifier among the plurality of memory cells, and the second group of the memory cells disposed between the first group and the third group.

6. The line memory device of claim 1, wherein the output unit comprises:
    a first shift register comprising a first plurality of flip-flops cascaded in series and configured to sample the output of the sense amplifier in response to a first edge of the read clock signal, the first edge corresponding to one of a rising edge and a falling edge;
    a second shift register comprising a second plurality of flip-flops cascaded in series and configured to sample the output of the sense amplifier in response to a second edge of the read clock signal, the second edge corresponding to an other of the rising edge and the falling edge;
    a multiplexer configured to select one of an output of the first shift register and an output of the second shift register in response to a retiming selection signal; and
    a retiming control block configured to generate the retiming selection signal based on the delays.

7. The line memory device of claim 6, wherein the retimed data bits corresponding to the memory data bits of first and third groups of the memory cells are provided from the second shift register that samples the output of the sense amplifier in response to the falling edge of the read clock signal, and the retimed data bits corresponding to the memory data bits of a second group of the memory cells are provided from the first shift register that samples the output of the sense amplifier in response to the rising edge of the read clock signal,
    the first group of the memory cells disposed farthest away from the sense amplifier among the plurality of memory cells, the third group of the memory cells disposed closest to the sense amplifier among the plurality of memory cells, and the second group of the memory cells disposed between the first group and the third group.

8. The line memory device of claim 6, wherein the retiming control block comprises:
    a detector configured to detect at least one retiming point based on the delays which are different from each other; and
    a selection signal generator configured to generate the retiming selection signal based on the at least one retiming point.

9. The line memory device of claim 8, wherein the detector comprises:
- a plurality of dummy memory cells configured to respectively store patterned data bits;
- a dummy sense amplifier;
- a dummy data line pair coupled to the dummy memory cells and to the dummy sense amplifier to sequentially transfer the patterned data bits from the dummy memory cells to the dummy sense amplifier, wherein each of the plurality of dummy memory cells is disposed a corresponding different distance from the dummy sense amplifier along the dummy data line pair such that the patterned data bits are transferred from the dummy memory cells to the dummy sense amplifier with corresponding dummy delays; and
- a detection signal generator configured to generate a detection signal by comparing first detection data bits and second detection data bits sampled from an output of the dummy sense amplifier, the detection signal indicating the at least one retiming point, the first detection data bits sampled in response to the first edge of the read clock signal, the second detection data bits sampled in response to the second edge of the read clock signal.

10. The line memory device of claim 9, wherein a connection of the dummy data line pair to the dummy memory cells and the dummy sense amplifier is substantially the same as a connection of the data line pair to the memory cells and the sense amplifier, and the dummy delays are each substantially the same as respective ones of the delays.

11. The line memory device of claim 9, wherein the dummy memory cells comprise read only memory (ROM) cells and the patterned data bits are stored in the ROM cells.

12. The line memory device of claim 9, wherein the dummy memory cells comprise one of random access memory (RAM) cells, latches and flip-flops, and the patterned data bits are written in the dummy memory cells based on data provided from an external device.

13. An image sensor comprising:
- a pixel array including a plurality of pixels configured to capture an image;
- an analog-to-digital convertor block configured to convert analog signals from the pixels to digital signals; and
- a line memory device configured to buffer the digital signals as memory data bits, the line memory device comprising
  - a plurality of memory cells each configured to store a respective different memory data bit from among the memory data bits;
  - a sense amplifier;
  - a data line pair coupled to the memory cells and to the sense amplifier to sequentially transfer the memory data bits from the memory cells to the sense amplifier, wherein each of the plurality of memory cells is disposed a corresponding different distance from the sense amplifier along the data line pair such that the memory data bits are transferred from the memory cells to the sense amplifier with delays that are different from each other, and wherein a first one of the memory cells is a farthest distance among the memory cells from the sense amplifier along the data line pair and stores a first data bit from among the memory data bits which is transferred to the sense amplifier with a longest delay among the delays; and
  - an output unit configured to sample an output of the sense amplifier for each of the memory data bits in response to a read clock signal so as to sequentially output retimed data bits each corresponding to a respective different one of the memory data bits,
wherein the read clock signal has a cyclic period which is less than the longest delay.

14. The image sensor of claim 13, wherein the memory data bits are sequentially transferred to the sense amplifier in order beginning from the first one of the memory cells and ending with a last one of the memory cells, wherein the last one of the memory cells is a shortest distance among the memory cells from the sense amplifier along the data line pair.

15. The image sensor of claim 13, wherein the memory data bits are sequentially transferred to the sense amplifier in order beginning from a last one of the memory cells and ending with the first one of the memory cells, wherein the last one of the memory cells is a shortest distance among the memory cells from the sense amplifier along the data line pair.

16. The image sensor of claim 13, wherein the output unit comprises:
- a first shift register comprising a first plurality of flip-flops cascaded in series and configured to sample the output of the sense amplifier in response to a first edge of the read clock signal, the first edge corresponding to one of a rising edge and a falling edge;
- a second shift register comprising a second plurality of flip-flops cascaded in series and configured to sample the output of the sense amplifier in response to a second edge of the read clock signal, the second edge corresponding to an other of the rising edge and the falling edge;
- a multiplexer configured to select one of an output of the first shift register and an output of the second shift register in response to a retiming selection signal; and
- a retiming control block configured to generate the retiming selection signal based on the delays.

17. The image sensor of claim 16, wherein the retiming control block comprises:
- a detector configured to detect at least one retiming point based on the delays which are different from each other; and
- a selection signal generator configured to generate the retiming selection signal based on the at least one retiming point.

18. The image sensor of claim 17, wherein the detector comprises:
- a plurality of dummy memory cells configured to respectively store patterned data bits;
- a dummy sense amplifier;
- a dummy data line pair coupled to the dummy memory cells and to the dummy sense amplifier to sequentially transfer the patterned data bits from the dummy memory cells to the dummy sense amplifier, wherein each of the plurality of dummy memory cells is disposed a corresponding different distance from the dummy sense amplifier along the dummy data line pair such that the patterned data bits are transferred from the dummy memory cells to the dummy sense amplifier with corresponding dummy delays; and
- a detection signal generator configured to generate a detection signal by comparing first detection data bits and second detection data bits sampled from an output of the dummy sense amplifier, the detection signal indicating the at least one retiming point, the first detection data bits sampled in response to the first edge of the read clock signal, the second detection data bits sampled in response to the second edge of the read clock signal.

19. A line memory device, comprising:
a plurality of memory cells each configured to store a respective different memory data bit from among memory data bits;
a sense amplifier;
a data line pair coupled to the memory cells and to the sense amplifier to sequentially transfer the memory data bits from the memory cells to the sense amplifier, wherein each of the plurality of memory cells is disposed a corresponding different distance from the sense amplifier along the data line pair such that the memory data bits are transferred from the memory cells to the sense amplifier with delays that are different from each other; and
an output unit configured to sample an output of the sense amplifier for each of the memory data bits in response to a read clock signal so as to sequentially output retimed data bits each corresponding to a respective different one of the memory data bits in response to a retiming selection signal,
wherein the output unit comprises a plurality of dummy memory cells, a dummy sense amplifier, a dummy data line pair, and a detection signal generator,
wherein the detection signal generator is configured to generate a detection signal by comparing first detection bits and second detection bits sampled from an output of the dummy sense amplifier, and the output unit is configured to generate the retiming selection signal based on the detection signal.

20. The line memory device of claim 19, wherein a connection of the dummy data line pair to the dummy memory cells and the dummy sense amplifier is substantially the same as a connection of the data line pair to the memory cells and the sense amplifier.

* * * * *